United States Patent
Lee et al.

(10) Patent No.: US 10,423,338 B2
(45) Date of Patent: Sep. 24, 2019

(54) METHOD OF EXTENDING LIFETIME OF SOLID STATE DISK

(71) Applicant: Apacer Technology Inc., New Taipei (TW)

(72) Inventors: Jiunn-Chang Lee, New Taipei (TW); Yin-Chuan Liao, New Taipei (TW)

(73) Assignee: Apacer Technology Inc., New Taipei (TW)

( * ) Notice: Subject to any disclaimer, the term of this patent is extended or adjusted under 35 U.S.C. 154(b) by 0 days.

(21) Appl. No.: 15/859,060

(22) Filed: Dec. 29, 2017

(65) Prior Publication Data

US 2019/0121551 A1   Apr. 25, 2019

(30) Foreign Application Priority Data

Oct. 24, 2017   (TW) .............................. 106136541 A

(51) Int. Cl.
| | | |
|---|---|---|
| *G11C 16/04* | (2006.01) | |
| *G06F 3/06* | (2006.01) | |
| *G11C 16/14* | (2006.01) | |
| *G11C 16/16* | (2006.01) | |
| *G11C 16/34* | (2006.01) | |

(52) U.S. Cl.
CPC ............ *G06F 3/0616* (2013.01); *G06F 3/064* (2013.01); *G06F 3/0661* (2013.01); *G06F 3/0679* (2013.01); *G11C 16/14* (2013.01); *G11C 16/16* (2013.01); *G11C 16/3445* (2013.01)

(58) Field of Classification Search
CPC ...... G06F 3/064; G06F 3/0661; G06F 3/0679; G11C 2029/1806
See application file for complete search history.

(56) References Cited

U.S. PATENT DOCUMENTS

| | | | |
|---|---|---|---|
| 2010/0174845 A1* | 7/2010 | Gorobets | ............ G06F 12/0246 711/103 |
| 2014/0297921 A1* | 10/2014 | Chang | ................ G06F 12/0246 711/103 |
| 2017/0115925 A1* | 4/2017 | Yan | ....................... G06F 3/0604 |
| 2018/0293003 A1* | 10/2018 | Muchherla | .......... G11C 11/5628 |

* cited by examiner

*Primary Examiner* — Uyen B Tran
(74) *Attorney, Agent, or Firm* — Muncy, Geissler, Olds & Lowe, P.C.

(57) ABSTRACT

The present disclosure illustrates a method of extending a lifetime of a solid state disk (SSD). The SSD includes a flash memory which is a multi-level cell (MLC) flash memory. The method includes steps of: setting a number of logic blocks of the SSD to be one-half of a number of physical blocks of the flash memory; reading, by a control unit of the SSD, a write/erase times of each of the physical blocks of the flash memory; and converting the physical block, of which a number of the write/erase times exceeds an upper limit of the write/erase times, from a multi-level storage format to a single-level storage format. A number of the logic blocks is a constant value.

4 Claims, 5 Drawing Sheets

METHOD OF EXTENDING LIFETIME OF SOLID STATE DISK

CROSS-REFERENCE TO RELATED APPLICATION

This application claims the benefit of Taiwan Patent Application No. 106136541, filed on Oct. 24, 2017, in the Taiwan Intellectual Property Office, the disclosure of which is incorporated herein in its entirety by reference.

BACKGROUND OF THE INVENTION

1. Field of the Invention

The present disclosure relates to method of extending a lifetime of a solid state disk (SSD), and more particularly to a method of reducing the level of the physical block which has been written or erased by a certain number of write/erase times, so as to extend the lifetime of the SSD.

2. Description of the Related Art

A solid state disk (SSD) generally includes a NAND flash memory to store data. The SSD includes a controller to perform various operations, and any of these details in the operations may affect the performance, the reliability and the stability of the SSD.

The flash memory stores data by using a memory cell array, and the formats of flash memories can be classified into single-level cell (SLC), multiple-level cell (MLC) or triple-level cell (TLC). A memory cell is implemented by a floating gate transistor. By controlling an amount of charges on the floating gate transistor to set a threshold voltage for turning on the memory cell, at least one more bit of information can be stored into the memory cell. When a particular voltage is applied to the control gate of the floating-gate transistor, the state of the floating gate transistor can indicate that one or more binary digits stored in the floating gate transistor.

However, when the memory cell cannot fully support the voltage level written or the voltage level is shifted or sticky, the operation of writing data may fail, and the block having this error is called a bad block.

In a current bad block management mechanism, the bad block will never be reused, so if the blocks which possibly become the bad blocks can be properly used in advance to enable the blocks to provide extra function before they become bad blocks, the usage efficiency of SSD can be effectively improved and the wastage can be prevented.

SUMMARY OF THE INVENTION

In order to achieve the objective, the present disclosure provides a method of extending a lifetime of a solid state disk (SSD). The SSD includes a flash memory which can be a multi-level cell (MLC) flash memory. The method includes steps of: setting a number of a logic block of the solid state disk to be one-half of a number of a physical block of the flash memory; reading, by a control unit of the SSD, a write/erase times of each of the physical blocks of the flash memory; converting the physical block, of which a number of the write/erase times exceeds an upper limit of write/erase times, from a multi-level storage format to a single-level storage format. The number of the logic blocks is a constant value.

In order to achieve the objective, the present disclosure provides a method of extending a lifetime of a SSD. The SSD includes a flash memory which is a three-level cell flash memory. The method includes: setting a number of logic blocks of the solid state disk to be one-third of a number of physical blocks of the flash memory; reading, by a control unit of the SSD, a write/erase times of each of the physical blocks of the flash memory; converting the physical block, of which a number of the first write/erase times exceeds an upper limit of first write/erase times, from a three-level storage format to a multi-level storage format; reading, by the control unit, a second write/erase times of the physical blocks converted into the multi-level storage format; converting the physical block, which is in the multi-level storage format and has a number of the second write/erase times exceeding an upper limit of second write/erase times, into the single-level storage format. The number of the logic blocks is a constant value.

In order to achieve the objective, the present disclosure provides a method of extending a lifetime of a SSD. The SSD includes a flash memory which is a three-level cell flash memory. The method includes: setting a number of logic blocks of the solid state disk to be one-third of a number of physical blocks of the flash memory; reading, by a control unit of the SSD, a write/erase times of each of the physical blocks of the flash memory; converting the physical block, of which a number of the write/erase times exceeds an upper limit of write/erase times, from a three-level storage format to a single-level storage format. The number of the logic blocks is a constant value.

According to above-mentioned content, the method of extending the lifetime of the SSD is to monitor the write/erase times of each of physical blocks, to determine whether the level reduction conversion of the storage format should be performed on the physical blocks, so that the converted physical block can be used continuously, to achieve the purpose of extending the lifetime of the SSD.

BRIEF DESCRIPTION OF THE DRAWINGS

The structure, operating principle and effects of the present disclosure will be described in detail by way of various embodiments which are illustrated in the accompanying drawings.

DETAILED DESCRIPTION OF THE PREFERRED EMBODIMENTS

Figure 1:
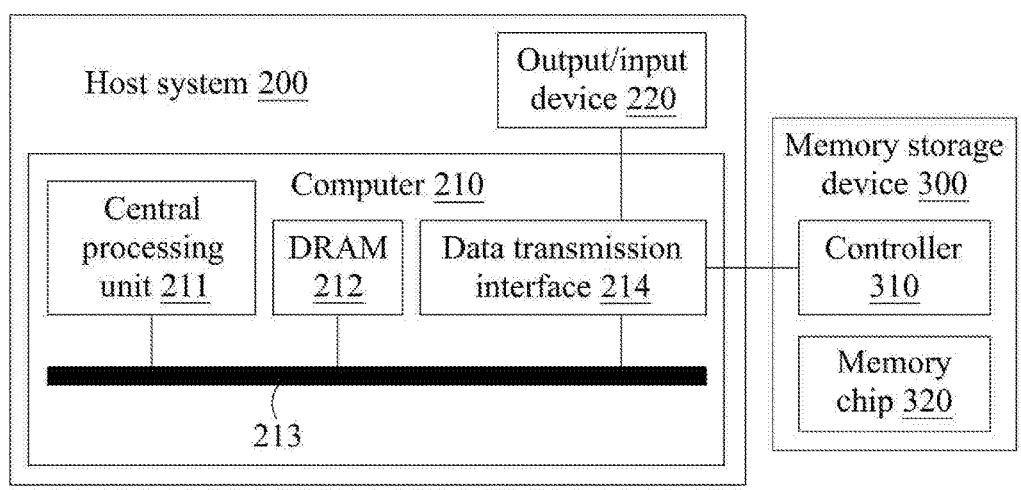
FIG. 1 is a schematic view of a host system and a memory storage device of the present disclosure.

The following embodiments of the present disclosure are herein described in detail with reference to the accompanying drawings. These drawings show specific examples of the embodiments of the present disclosure. It is to be understood that these embodiments are exemplary implementations and are not to be construed as limiting the scope of the present disclosure in any way. Further modifications to the disclosed embodiments, as well as other embodiments, are also included within the scope of the appended claims. These embodiments are provided so that this disclosure is thorough and complete, and fully conveys the inventive concept to those skilled in the art. Regarding the drawings, the relative proportions and ratios of elements in the drawings may be exaggerated or diminished in size for the sake of clarity and convenience. Such arbitrary proportions are only illustrative and not limiting in any way. The same reference numbers are used in the drawings and description to refer to the same or like parts.

It is to be understood that, although the terms 'first', 'second', 'third', and so on, may be used herein to describe various elements, these elements should not be limited by these terms. These terms are used only for the purpose of distinguishing one component from another component. Thus, a first element discussed herein could be termed a second element without altering the description of the present disclosure. As used herein, the term "or" includes any and all combinations of one or more of the associated listed items.

Please refer to FIG. 1, which is a schematic view of a host system and a memory storage device of the present disclosure. The memory storage device 300 may include a controller 310 and a memory chip 320, wherein the memory chip 320 is generally a nonvolatile memory which is shared to the memory storage device 300 and the host system 200. The host system 200 can write data into the memory storage device 300 or read data from the memory storage device 300. The memory storage device 300 can be a rewritable nonvolatile memory storage device, such as a flash disk, a memory card or a SSD.

The host system 200 of the present disclosure includes a computer 210 and an output/input device 220, and the computer 210 may include a central processing unit 211, a DRAM 212, a system bus 213 and a data transmission interface 214, and the output/input device 220 may include a mouse, a keyboard, a screen, a printer, a microphone or a speaker. However, the output/input device 220 of the present disclosure is not limited to above examples, and can include other devices. The system bus 213 can be electrically connected to the central processing unit 211, the DRAM 212 and the data transmission interface 214, and configured to reduce cost and perform modularization.

In the embodiment of the present disclosure, the memory storage device 300 is electrically connected to the computer 210 through the data transmission interface 214. Furthermore, the computer 210 can write data into the memory storage device 300 or read data from the memory storage device 300, through operations of the central processing unit 211, the DRAM 212 and the output/input device 220. The data transmission interface 214 may include Small Computer System Interface (SCSI), Advanced Technology Attachment (ATA) interface, Serial Attached SCSI (SAS) interface or Serial Advanced Technology Attachment (SATA) interface.

Figure 2:
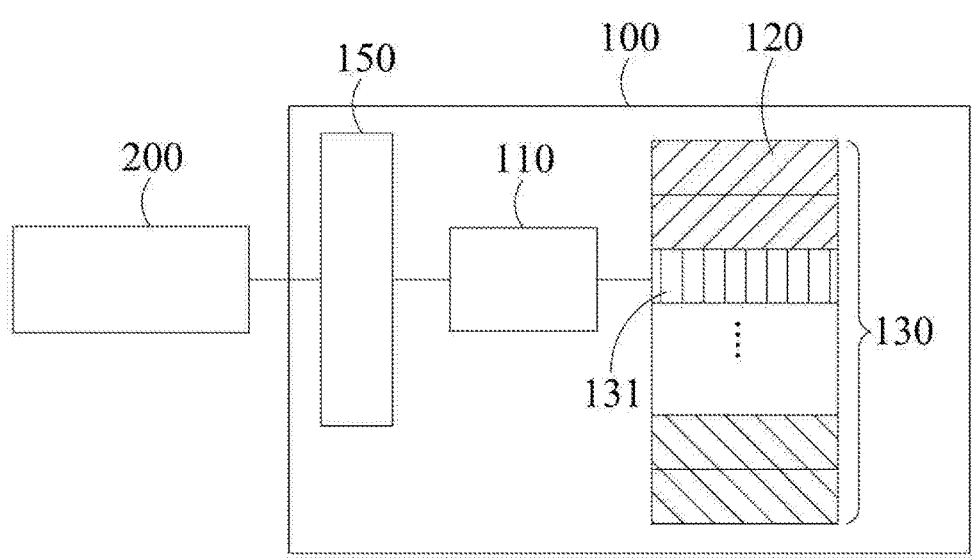
FIG. 2 is a schematic view of a flash memory and a host system of the present disclosure.

Please refer to FIGS. 1 and 2. FIG. 2 is a schematic view of a flash memory and a host system of the present disclosure. As shown in FIGS. 1 and 2, the flash memory 100 of FIG. 2 corresponds to the memory storage device 300 of FIG. 1, and the flash memory 100 is electrically connected to the host system 200 through the connector 150. The transmission interface of the connector 150 includes the data transmission interface 214 of FIG. 1. Preferably, the connector 150 can be a SATA connector, a SAS connector, an iSCSI connector, a USB connector or a M.2 connector.

Preferably, the flash memory 100 can be a multi-level cell flash memory or a triple-level storage flash memory.

The flash memory 100 may include a control unit 110, a data cache area 120 and a plurality of physical blocks 130. The control unit 110 is configured to execute logic gates or control instructions which can be implemented by hardware, firmware or a combination thereof. By executing the instructions of the host system 200, the data can be written into the physical block 130, read from the physical block 130, or erased from the physical block 130. The physical block 130 includes a plurality of data storage pages 131 configured to store the data written from the host system 200. The data storage page 131 is a minimal unit for the control unit 110 to erase data in the flash memory 100. In this embodiment, the format of the physical block 130 can be the multi-level storage format or the three-level storage format, that is, the physical block 130 can be the multi-level cell flash memory or the triple-level storage flash memory.

Figure 3:
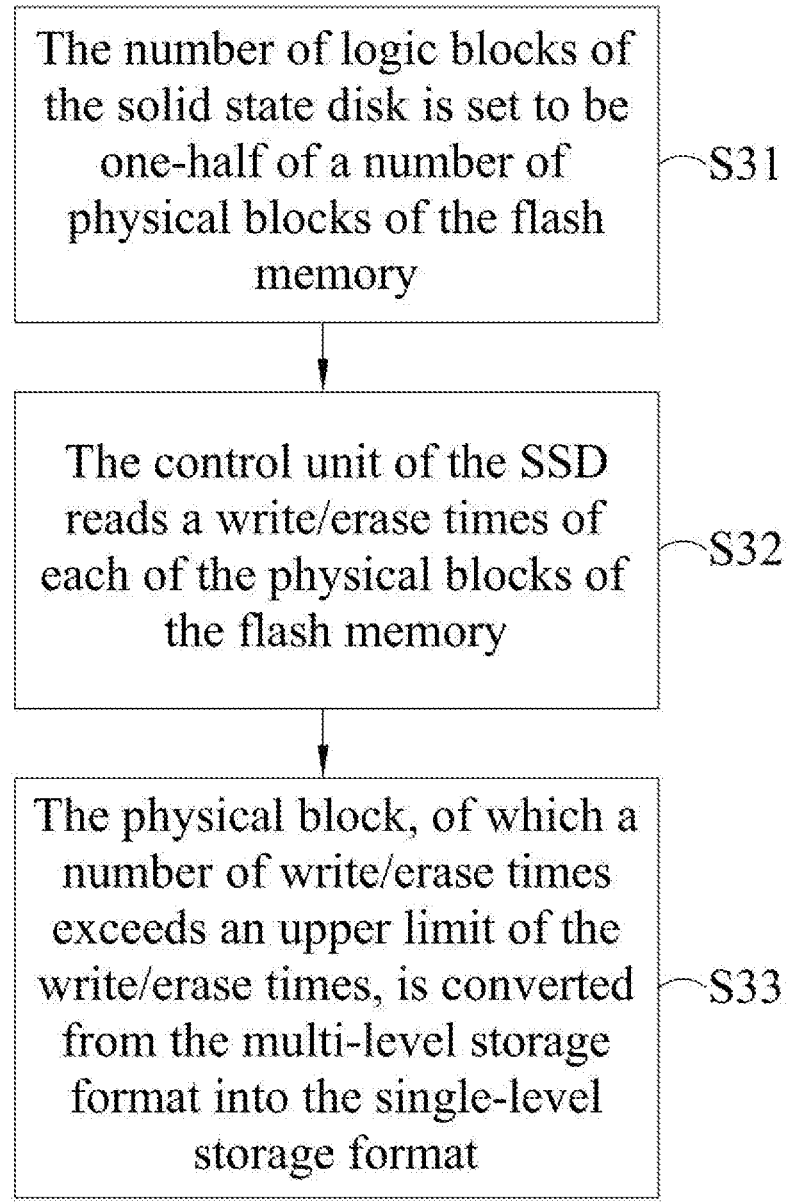
FIG. 3 is a first flowchart showing the steps in an operation of a method of extending a lifetime of SSD, in accordance with the present disclosure.

The following refers to FIG. 3, which is a first flowchart showing the steps in an operation of the method of extending a lifetime of the SSD, in accordance with the present disclosure. The method is applied to the SSD including the flash memory which is a multi-level cell flash memory. The method includes steps S31 through S33.

In the step S31, a number of logic blocks of the solid state disk is set to be one-half of a number of physical blocks of the flash memory. The number of the logic blocks is a constant value.

In the step S32, the control unit of the SSD reads a write/erase times of each of the physical blocks of the flash memory.

In the step S33, the physical block, of which a number of write/erase times exceeds an upper limit of the write/erase times, is converted from the multi-level storage format into the single-level storage format. The upper limit of the write/erase times can be determined upon practical demand.

The control unit 110 can execute the steps S31 through S33. Each of the physical blocks described in the steps S31 through S33 can include a plurality of data storage pages. For example, the physical block can include 128 data storage pages, and each data storage page can include 512 Bytes or a multiple of 512 Bytes, such as 1024 Bytes or 2048 Bytes; however, the present disclosure is not limited to these examples, and the physical block can include 64 data storage pages or 256 data storage pages.

Under a condition that all physical blocks are converted into the single-level storage format, when a bad block ratio of the physical blocks converted into the single-level storage format is higher than a preset ratio, the SSD enters a read-only state. Preferably, the preset ratio can be set by the SSD manufacturer, and is generally set as 6.8%.

After the physical block is converted from the multi-level storage format into the single-level storage format, the capacity of the physical block in the single-level storage format become one-half of the capacity of the physical block in the multi-level storage format. In this embodiment, in the beginning, the number of the physical blocks in the multi-level storage format is two times of the number of the logic blocks of the SSD, after all physical blocks in the multi-level storage format are converted into the single-level storage format, the capacity of the physical block converted into the single-level storage format is one-half of the capacity of the physical block initially in multi-level storage format, in other words, the capacity of the flash memory is equal to the logic access capacity of the SSD.

For example, the capacity of the flash memory in the multi-level storage format is 100 G, and the logic access capacity of the flash memory is set to be 50 G; in this condition, the host system 200 can automatically determine to store the data to the physical block in the multi-level storage format according to a mapping table. Practically, the number of the physical block, which is accessible, is two times of logic access capacity. Compared with the general flash memory in multi-level storage format and having 50G capacity, and the write/erase times of the flash memory of this embodiment become two times of that of the general flash memory in the multi-level storage format. In greater detail, the write/erase times of the general flash memory in the multi-level storage format is about 3,000 to 5,000 times; in this embodiment, a number of the physical blocks to be accessed is two times of the logic access capacity, so that the user can experience that the write/erase times for the logic access capacity of the flash memory can be up to 6,000 to 10,000 times.

Figure 4:
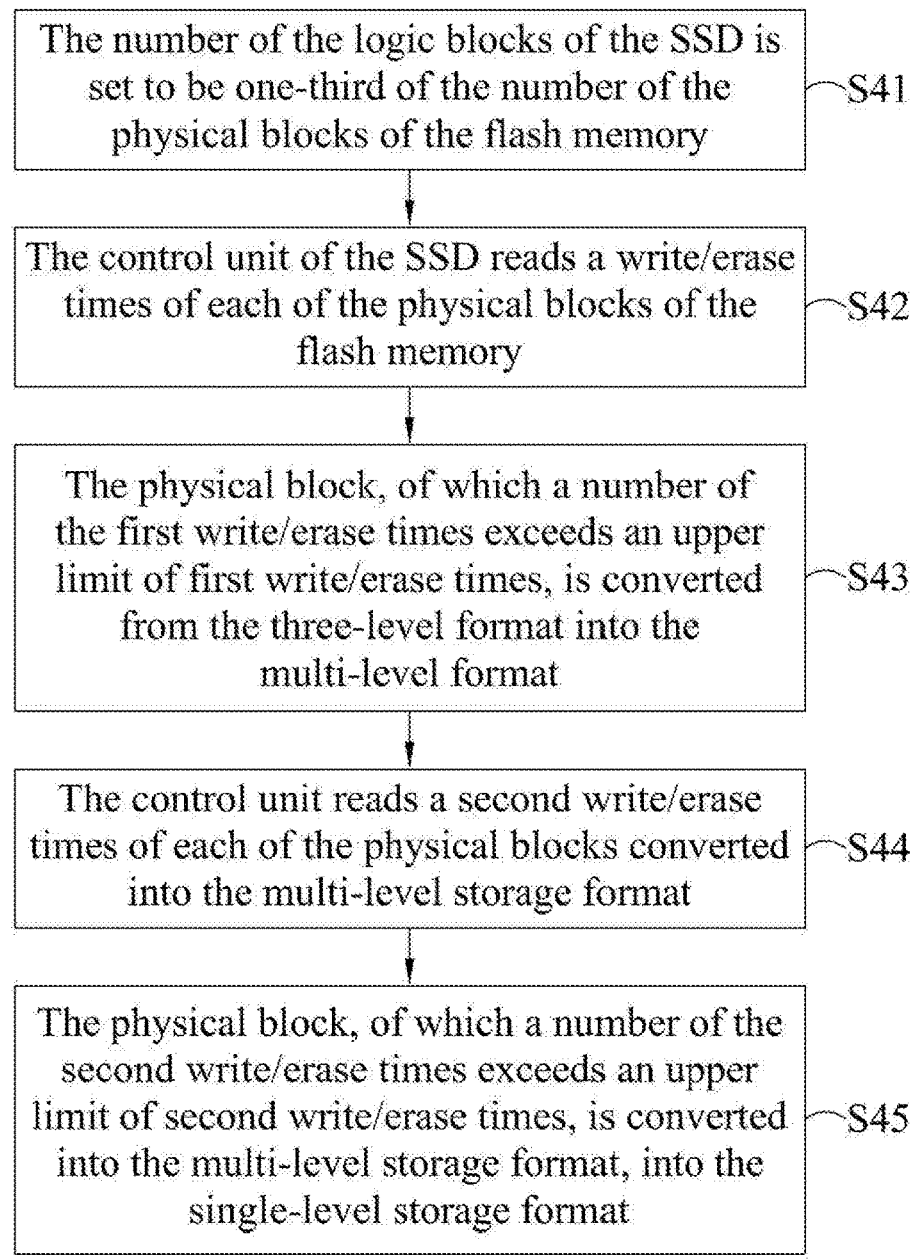
FIG. 4 is a second flowchart showing the steps in an operation of a method of extending a lifetime of SSD, in accordance with the present disclosure.

Please refer to FIG. 4, which is a second flowchart showing the steps in an operation of a method of extending the lifetime of the SSD. In this embodiment, the flash memory is the triple-level storage flash memory, and the method includes following steps S41 through S45.

In the step S41, the number of the logic blocks of the SSD is set to be one-third of the number of the physical blocks of the flash memory. The number of the logic blocks is a constant value.

In the step S42, the control unit of the SSD reads a write/erase times of each of the physical blocks of the flash memory.

In the step S43: the physical block, of which a number of the first write/erase times exceeds an upper limit of first write/erase times, is converted from the three-level storage format into the multi-level storage format.

In the step S44, the control unit reads a second write/erase times of each of the physical blocks converted into the multi-level storage format.

In the step S45, the physical block, of which a number of the second write/erase times exceeds an upper limit of second write/erase times, is converted into the multi-level storage format, into the single-level storage format.

The control unit can execute the steps S41 through S45. The functions of the physical block and the data storage page are described in aforementioned embodiments, so their descriptions are not repeated.

After the physical blocks are converted from the three-level storage format into the multi-level storage format, the capacity of the physical block in the multi-level storage format become two-third of the capacity of the physical block in the three-level storage format. In this embodiment, in the beginning, the number of the physical blocks in the three-level storage format is three times of the number of the logic blocks of the SSD, after all the physical blocks in the three-level storage format are converted into the multi-level storage format, the capacity of the physical blocks converted into the multi-level storage format becomes two-third of the capacity of the physical blocks of the three-level storage format initially, in other words, the practical accessible capacity of the flash memory is equal to two times of the logic access capacity of the SSD.

In an embodiment, the capacity of the flash memory in the three-level storage format can be 100 G, and the logic access capacity of the flash memory can be set to be 33.3 G; in this condition, the host system 200 can automatically determine to store the data to the physical block in the three-level storage format according to a mapping table. Practically, the number of the physical block, which is accessible, is three times of the logic access capacity. Compared with the general flash memory in the three-level storage format, the write/erase times of the flash memory of this embodiment can become three times of that of other general flash memory in three-level storage format. When all physical blocks are converted into multi-level storage format, the capacity of the flash memory becomes 66.67 G, and the write/erase times of the converted flash memory becomes two times of that of the 66.7 G flash memory in multi-level storage format. The reason has been described in previous content, so it is not repeated.

Figure 5:
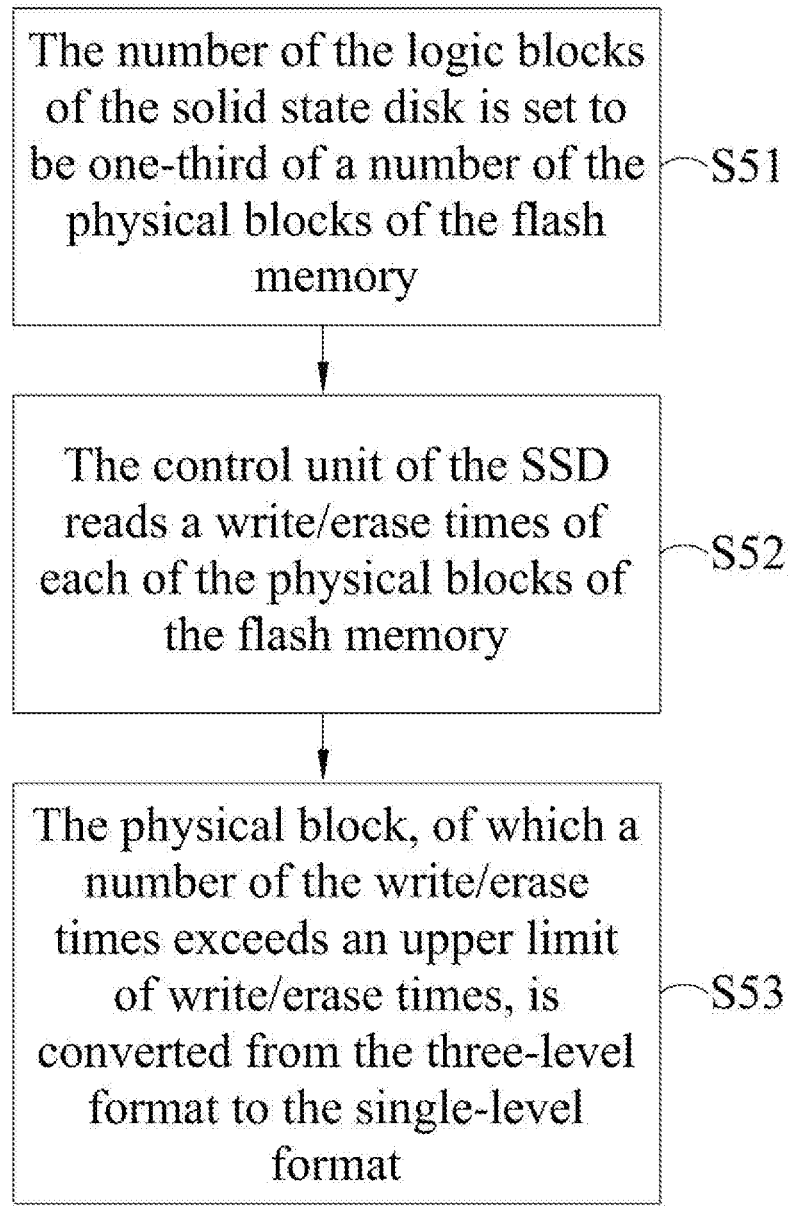
FIG. 5 is a third flowchart showing the steps in an operation of a method of extending a lifetime of SSD, in accordance with the present disclosure.

Please refer to FIG. 5, which is a third flowchart showing the steps in an operation of a method of extending a lifetime of a SSD, in accordance with the present disclosure. The method is applied to the SSD including the flash memory which is a three-level cell flash memory. The method includes steps S51 through S53.

In the step S51, the number of the logic blocks of the solid state disk is set to be one-third of a number of the physical blocks of the flash memory. The number of the logic blocks is a constant value.

In the step S52, the control unit of the SSD reads a write/erase times of each of the physical blocks of the flash memory.

In the step S53, the physical block, of which a number of the write/erase times exceeds an upper limit of write/erase times, is converted from the three-level storage format to the single-level storage format.

The control unit can execute the steps S51 to S53. The functions of the physical block and the data storage page are described in aforementioned embodiments, so their descriptions are not repeated.

After the physical blocks are converted from the three-level storage format into the single-level storage format, the capacity of the physical block in the single-level storage format become one-third of the capacity of the physical block in the three-level storage format. In this embodiment, in the beginning, the number of the physical blocks in the three-level storage format is three times of the number of the logic blocks of the SSD, and after all physical blocks in the three-level storage format are converted into the single-level storage format, the capacity of the physical blocks converted into the single-level storage format is one-third of that of the physical blocks in the three-level storage format initially, in other words, the capacity of the flash memory is equal to the logic access capacity of the SSD.

In an embodiment, the capacity of the flash memory in the three-level storage format can be 100 G, and the logic access capacity of the flash memory is set to be 33.3 G; in this condition, the host system 200 can automatically determine to store the data to the physical block in the three-level storage format according to a mapping table, and practically, the number of the physical block, which is accessible, is two times of the logic access capacity. Compared with the flash memory in the three-level storage format, the write/erase times of the flash memory of this embodiment can become three times of that of the 33.3 G flash memory in the multi-level storage format. The reason has been described in previous content, so it is not repeated.

According to above-mentioned content, the method of extending the lifetime of the SSD is to monitor the write/erase times of each of the physical blocks, to determine whether the level reduction conversion of the storage format should be performed on the physical block, so that the converted physical block can be used continuously, to achieve the objective of extending the lifetime of the SSD.

The present disclosure disclosed herein has been described by means of specific embodiments. However, numerous modifications, variations and enhancements can be made thereto by those skilled in the art without departing from the spirit and scope of the disclosure set forth in the claims.

What is claimed is:

1. A method of extending lifetime of a solid state disk (SSD), and the SSD comprising a flash memory which is a three-level cell (TLC) flash memory, and the method comprising:

setting a number of logic blocks of the SSD to be one-third of a number of physical blocks of the flash memory;

reading, by a control unit of the SSD, a first write/erase times of each of the physical blocks of the flash memory;

converting the physical block, of which a number of the first write/erase times exceeds an upper limit of the first write/erase times, from a three-level storage format to a multi-level storage format;

reading, by the control unit, a second write/erase times of each of the physical blocks converted into the multi-level storage format; and converting the physical block, which is in the multi-level storage format and a number of the second write/erase times exceeds an upper limit of the second write/erase times, into a single-level storage format;

wherein a number of the logic blocks is a constant value.

2. The method according to claim 1, wherein when all physical blocks are converted into the single-level storage format and a bad block ratio of the physical blocks converted into the single-level storage format is higher than a preset ratio, the SSD enters a read-only state.

3. The method according to claim 1, wherein a capacity of each of the physical blocks in the multi-level storage format is two-thirds of capacity of each of the physical blocks in the three-level storage format, and when all physical blocks are converted into the multi-level storage format, the capacity of the flash memory is reduced to two-thirds.

4. The method according to claim 3, wherein a capacity of each of the physical blocks in the single-level storage format is one-half of capacity of each of the physical blocks in the multi-level storage format, and when all physical blocks are converted into the single-level storage format, the capacity of the flash memory is equal to a logic access capacity of the SSD.

* * * * *